United States Patent
Stone et al.

(10) Patent No.: US 7,205,556 B2
(45) Date of Patent: Apr. 17, 2007

(54) BELLOWS LINER FOR AN ION BEAM IMPLANTER

(75) Inventors: Lyudmila Stone, Lynnfield, MA (US); Scott T. Barusso, Gloucester, MA (US); Dale K. Stone, Lynnfield, MA (US); Alexander S. Perel, Danvers, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 194 days.

(21) Appl. No.: 10/956,817

(22) Filed: Oct. 1, 2004

(65) Prior Publication Data

US 2006/0071181 A1   Apr. 6, 2006

(51) Int. Cl.
*H01J 37/317* (2006.01)
(52) U.S. Cl. .................................. 250/492.21
(58) Field of Classification Search .............. None
See application file for complete search history.

(56) References Cited

U.S. PATENT DOCUMENTS

| | | | |
|---|---|---|---|
| 5,407,992 A * | 4/1995 | Lee et al. | 427/523 |
| 5,670,217 A * | 9/1997 | Blake et al. | 427/476 |
| 5,736,473 A | 4/1998 | Cohen et al. | |
| 6,231,054 B1 | 5/2001 | Allen, Jr. et al. | |
| 6,362,490 B1 | 3/2002 | Tomita et al. | |
| 2002/0158213 A1 | 10/2002 | Matsuaga et al. | |
| 2005/0274910 A1 * | 12/2005 | Desai et al. | 250/492.21 |

FOREIGN PATENT DOCUMENTS

| | | |
|---|---|---|
| JP | 59184443 | 10/1984 |
| JP | 10027565 | 1/1998 |

OTHER PUBLICATIONS 5 pg PCT Int'l Search Report (Form PCT/ISA/210) fm corresponding PCT Int'l Appl. No. PCT/US2005/036567, Int'l Filing Date: Sep. 28, 2005; Priority Date: Oct. 1, 2004.

* cited by examiner

*Primary Examiner*—Jack I. Berman
(74) *Attorney, Agent, or Firm*—Tarolli, Sundheim, Covell & Tummino, L.P.A.

(57) ABSTRACT

An ion beam implanter includes ion beam forming and directing apparatus and an implantation station where workpieces are implanted with ions from an ion beam. The beam travels along an evacuated path from an ion source to the implantation station. A flexible bellows couples the implantation station to the beam forming and directing apparatus permitting the implantation station to be pivoted with respect to the beam forming and directing apparatus and thereby change an implantation orientation of the workpieces with respect to the ion beam. A replaceable, flexible bellows liner is disposed within an interior region of the bellows to reduce the volume of implantation byproducts deposited on an interior surface of the bellows.

19 Claims, 5 Drawing Sheets

BELLOWS LINER FOR AN ION BEAM IMPLANTER

FIELD OF THE INVENTION

The present invention relates to an ion beam implanter and, more particularly, to a flexible liner for a bellows coupling two regions of an ion beam implanter that move relative to each other.

BACKGROUND OF THE INVENTION

Ion beam implanters are widely used in the process of doping of semiconductor wafers. An ion beam implanter generates an ion beam comprised of desired species of positively charged ions. The ion beam impinges upon an exposed surface of a semiconductor wafer workpiece thereby "doping" or implanting the workpiece surface with desired ions.

One type of ion beam implanter uses a rotating, translating disk-shaped support on which workpieces are mounted. A plurality of semiconductor workpieces are mounted on the disk-shaped support. The support is supported in an implantation chamber of an end or implantation station of the ion beam implanter. The rotation of the support allows each of the plurality of workpieces to be exposed to the ion beam during a production run.

To achieve proper implantation depth and dosage and to avoid certain detrimental effects such as channeling, an implantation orientation of a workpiece needs to be able to be adjusted with respect to two axes which are orthogonal to the direction of the ion beam. If the ion beam is assumed to travel along the z axis, the workpiece needs to be able to be tilted or angled with respect to both the x (horizontal) axis and y (vertical) axis. Tilting the workpiece implantation surface with respect to the x axis is referred to as changing the alpha ($\alpha$) angle of the workpiece and tilting the workpiece implantation surface with respect to the y axis is referred to as changing the beta ($\beta$) angle of the workpiece.

To change implantation orientation, the implantation station must be able to pivot with respect to ion beam forming and directing apparatus of the implanter, that is, the portion of the implanter that forms and directs the ion beam prior to the beam entering an interior region of the implantation station. Since the implantation station must move with respect to the beam forming and directing apparatus of the implanter and further since the implantation station interior region and the interior region defined by the beam forming and directing apparatus are both evacuated, a flexible vacuum seal or bellows must be provided between implantation station and the beam forming and directing apparatus.

Because the bellows is adjacent the implantation station, over time, the bellows interior becomes coated by implantation byproducts, that is, undesirable particles and flakes of material that are generated from the implantation process and which subsequently float around in the interior regions of the implantation station and the beam forming and directing apparatus. Such implantation byproducts include materials sputtered off workpieces and other surfaces which the ion beam impinges. When the bellows are subsequently exercised or flexed to change the position of the implantation station, the implantation byproducts deposited on the bellows interior are prone to break off or dislodge and float around within the interior regions of the implantation station and the beam forming and directing structure. Such dislodged flake and particle byproducts may ultimately be deposited on the workpieces causing contamination of the workpieces and degrading the uniformity and quality of the implantation. Further, another source of implantation byproducts in the form of silicon dust from pieces of broken workpieces are often trapped in the convolutions of bellows. In addition to generating particles that may be deposited on workpieces, such pieces may also cause vacuum leaks.

Cleaning a bellows is difficult and often ineffective. Moreover, replacing the bellows is costly. What is needed is a device that will shield the bellows from implantation byproducts. What is also needed is a device that will reduce workpiece contamination resulting from implantation byproducts. What is additionally needed is a device to prolong the life of the bellows

SUMMARY OF THE INVENTION

In accordance with the present invention, an ion beam implanter for implanting a workpiece with ions from an ion beam is disclosed. The ion implanter includes an implantation station defining an evacuated implantation chamber. One or more workpieces are supported on a support disposed within the implantation chamber. The ion implanter further includes ion beam forming and directing apparatus forming and directing the ion beam from an ion source to the implantation station. The beam forming and directing apparatus defines an evacuated interior region through which the ion beam passes from the ion source to the implantation station.

The implanter further includes flexible vacuum seal or bellows coupling the implantation station and the beam forming and directing apparatus. Preferably, the bellows is a flexible, cylindrical shaped bellows comprising a series of welded convolutions which flex to permit the bellows to curve with respect to a central axis of the bellows.

The ion beam passes through an open interior region of the bellows. The flexibility of the bellows permits relative movement of the implantation station with respect to the beam forming and directing apparatus. The implanter advantageously further includes a flexible liner or sleeve for the bellows. The liner is disposed within an interior region of the bellows. The liner shields the bellows from implantation byproducts generated during the implantation process thereby extending the useful life of the bellows. Like the bellows, the liner is flexible and does not interfere with bellows operation.

During implantation, the bellows liner collects implantation byproducts that contact the liner thereby reducing workpiece contamination and reducing the volume of implantation byproducts deposited on an interior surface of the bellows. Advantageously, once coated with implantation byproducts, the bellows liner is easily replaced during routine maintenance of the implanter.

These and other objects, features and advantages of the invention will become better understood from the detailed description of the preferred embodiments of the invention which are described in conjunction with the accompanying drawings.

DETAILED DESCRIPTION

Figure 1:
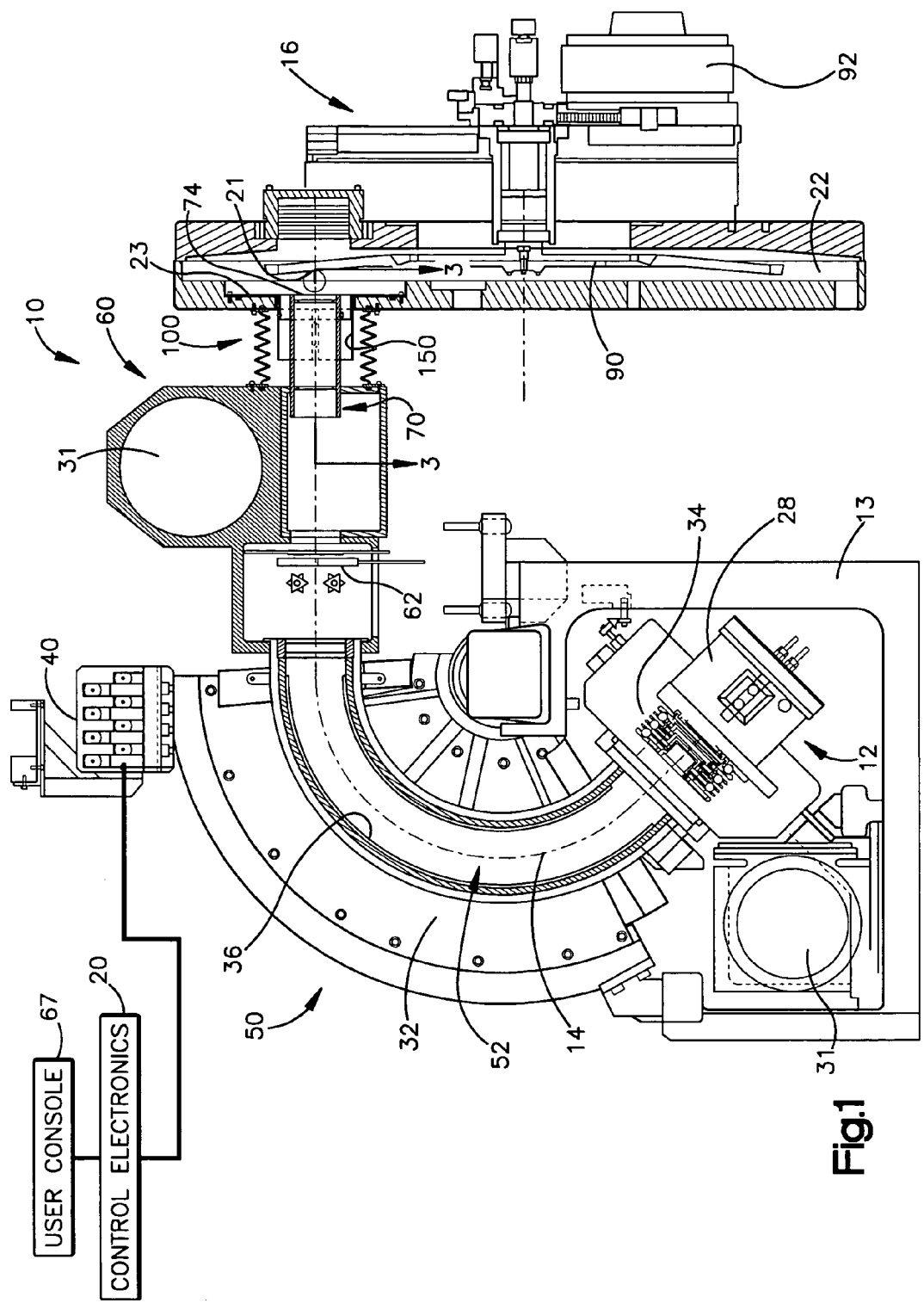
FIG. 1 is a schematic plan view of an ion beam implanter of the present invention.

An ion beam implanter is shown generally at 10 in FIG. 1. The implanter 10 includes an ion source 12 mounted to an "L" shaped support 13 for providing ions that form an ion beam 14 which traverses a beam path to an implantation or end station 16. Control electronics (shown schematically at 20) are provided for monitoring and controlling the ion dosage received by a plurality of workpieces 21, such as semiconductor wafer workpieces, within an evacuated implantation region or chamber 22 of the implantation station 16. Operator input to the control electronics 20 is performed via a user console 67.

The ion source housing 12 generates the ion beam 14 which impacts the wafer workpieces 21 disposed on a rotating and translating disk-shaped support 90 in the implantation chamber 22. Although a rotating, translating support 90 is disclosed, it should also be appreciated that the present invention is equally applicable to a "serial" ion beam implanter, that is, one in which the ion beam is directed to scan over the surface of a stationary workpiece. The ions in the ion beam 14 tend to diverge as the beam traverses a distance between the ion source 12 and the implantation station 16. The ion source 12 includes a plasma chamber 28 defining an interior region into which source materials are injected. The source materials may include an ionizable gas or vaporized source material. Source material in solid form is deposited into a vaporizer which is then injected into the plasma chamber. The positively charged ions exit ion source and are formed into the ion beam 14 and directed through an evacuated region to the implantation station 16 by beam forming and directing apparatus 50.

During a production run, evacuation of a beam path 15 along which the ion beam 14 travels is provided by a pressure regulation system 55 comprising a pair of vacuum pumps 31. One application of an ion source 12 constructed in accordance with the present invention is for a "low" energy implanter. The ion beam 14 of this type of implanter tends to diffuse over its beam path and hence the implanter 10 has been designed to have a relatively "short" path from the source 12 to the implantation chamber 22.

Ions in the plasma chamber 28 are extracted an opening in the plasma chamber and are formed into the ion beam 14 that traverses the distance between the ion source 12 and the implantation station 16 by the beam forming and directing apparatus 50. The beam forming and directing apparatus 50 includes a mass analyzing or resolving magnet 32 and a set of electrodes 34. The plasma chamber ions are accelerated by the set of electrodes 34 adjacent the plasma chamber toward the mass analyzing magnet 32 fixed to the support 13. The set of electrodes 34 extract the ions from the plasma chamber interior and accelerate the ions into a region bounded by the mass analyzing magnet 32. A portion of the ion beam path 15 through the magnet region is bounded by an aluminum beam guide 36. During production runs, an interior region 52 defined by the beam forming and directing apparatus 50 is evacuated by the pumps 31.

Ions that make up the ion beam 14 move from the ion source 12 into a magnetic field set up by the mass analyzing magnet 32. The strength and orientation of the magnetic field produced by the analyzing magnet 32 is controlled by the control electronics 20 coupled to a magnet connector 40 for adjusting a current through the magnet's field windings.

The mass analyzing magnet 32 causes only those ions having an appropriate mass to charge ratio to reach the ion implantation station 16. The ionization of source materials in the plasma chamber 28 generates a species of positively charged ions having a desired atomic mass. However, in addition to the desired species of ions, the ionization process will also generate a proportion of ions having other than the proper atomic mass. Ions having an atomic mass above or below the proper atomic mass are not suitable for implantation.

The magnetic field generated by the mass analyzing magnet 32 causes the ions in the ion beam 14 to move in a curved trajectory. The magnetic field that is established by the control electronics 20 is such that only ions having an atomic mass equal to the atomic mass of the desired ion species traverse the curved beam path to the implantation station implantation chamber 22.

Located downstream from the analyzing magnet 32 is a resolving housing 60 which is also part of the beam forming and directing apparatus 50. The resolving housing 60 supports a resolving plate 62 comprised of vitreous graphite and defines an elongated aperture through which the ions in the ion beam 14 pass. At the resolving plate 62, the ion beam dispersion, that is, a width of the ion beam envelope, is at a minimum for production runs.

The resolving plate 62 functions in conjunction with the mass analyzing magnet 32 to eliminate undesirable ion species from the ion beam 14 which have an atomic mass close to, but not identical, to the atomic mass of the desired species of ions. As explained above, the strength and orientation of the mass analyzing magnet's magnetic field is established by the control electronics 20 such that only ions having an atomic weight equal to the atomic weight of the desired species will traverse the predetermined, desired beam path to the implantation station 16. Undesirable species of ions having an atomic mass much larger or much smaller than the desired ion atomic mass are sharply deflected and impact the beam guide 36 or the slit boundary defined by the resolving plate 62.

The resolving housing 60 also supports a plasma electron shower 70 through which the beam 14 passes. The ions extracted from the plasma chamber 28 are positively charged. If the positive charge on the ions is not neutralized prior to implantation of the workpieces 21, the doped wafers will exhibit a net positive charge. Such a net positive charge on a workpiece 21 has undesirable characteristics.

A downstream end 74 of an extension tube of the plasma shower 70 extends through a flexible bellows 100, described below, and is adjacent the implantation chamber 22 where the workpieces 21 are implanted with ions. Supported within the implantation chamber is the disk-shaped workpiece support 90. Workpieces 21 to be treated are positioned near an outer edge of the support 90 and the support is rotated at a constant angular velocity by a motor 92. The ion beam 14 strikes the workpieces 21 as they rotate in a circular path. A stepper motor also drives a lead screw to translate the support 90. This permits multiple rows of workpieces to be implanted during a production run. Ion dosage received by the workpieces 21 determined by the velocity of translation of the support 90 under the control of the control electronics 20.

Flexible Bellows 100

The beam forming and directing apparatus 50 further includes the flexible bellows 100 which mechanically couples the implantation station 16 to the resolving housing 60 and allows the implantation station 16 to pivot with respect to the beam forming and directing apparatus 50 and specifically with respect to the resolving housing 60. The bellows 100 provides a vacuum seal such between the evacuated implantation chamber 22 and the evacuated interior region 52 of the beam forming and directing apparatus 50 and outside atmosphere.

Figure 2:
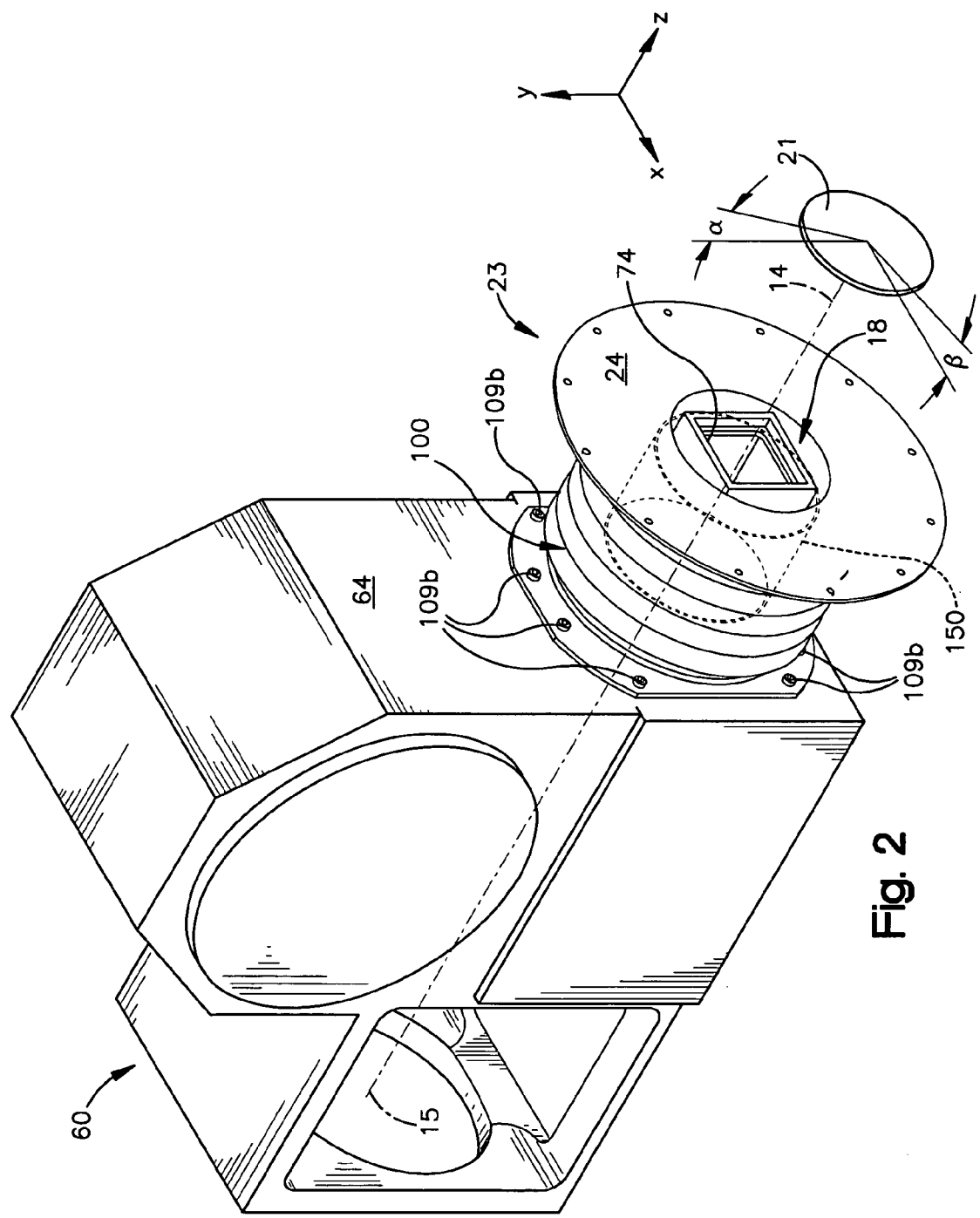
FIG. 2 is a schematic perspective view of selected components of the ion beam implanter of FIG. 1.
Figure 2A:
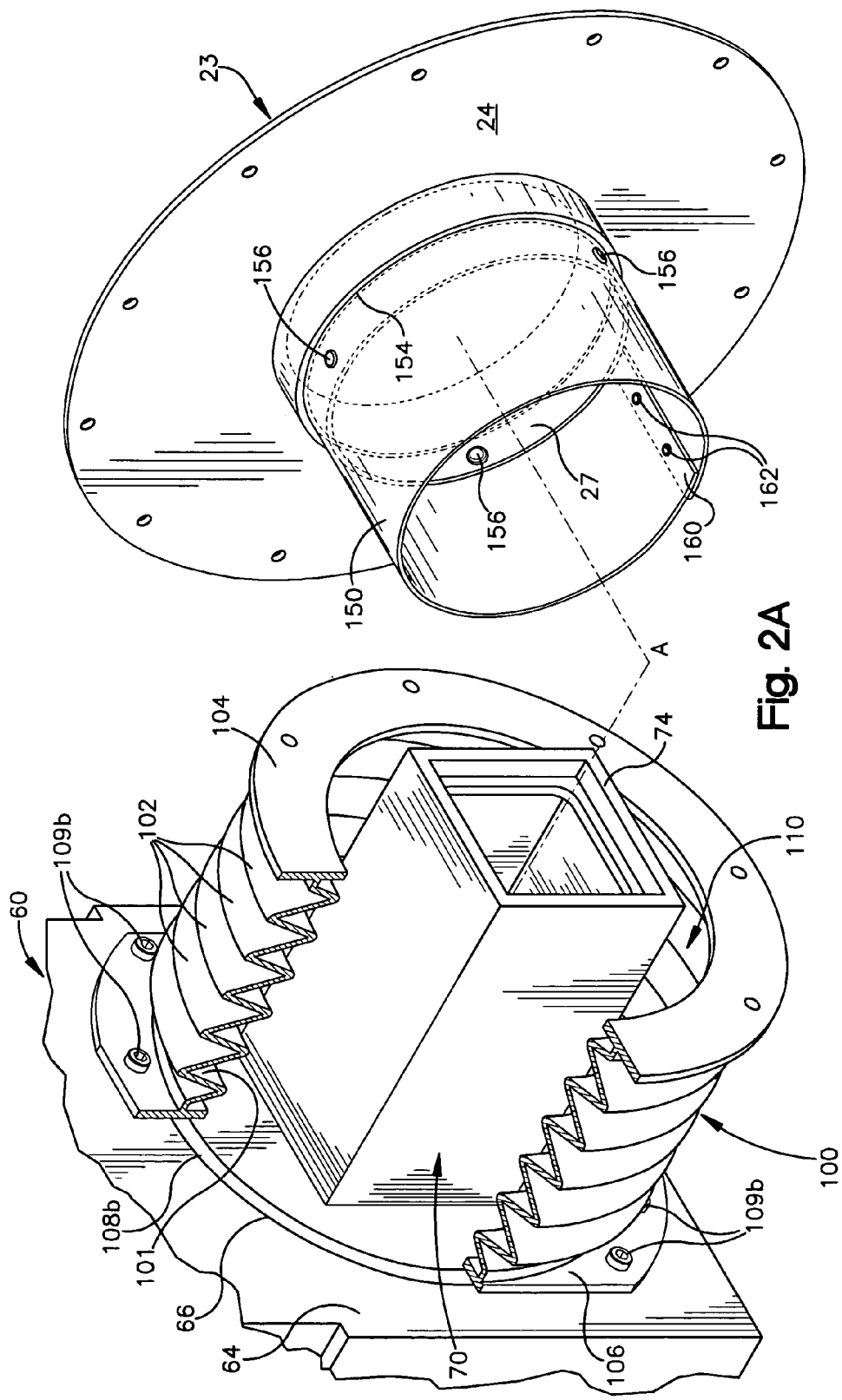
FIG. 2A is an enlarged, exploded perspective view of a portion of FIG. 2.

Pivoting of the implantation station 16 with respect to the resolving housing 60 permits tilting of the workpiece 21 with respect to the ion beam 14 in two directions (x and y axes) orthogonal to the beam line 15 such that an implantation orientation of the workpiece 21 may be changed with respect to both α and β angles (FIG. 2).

Figure 3:
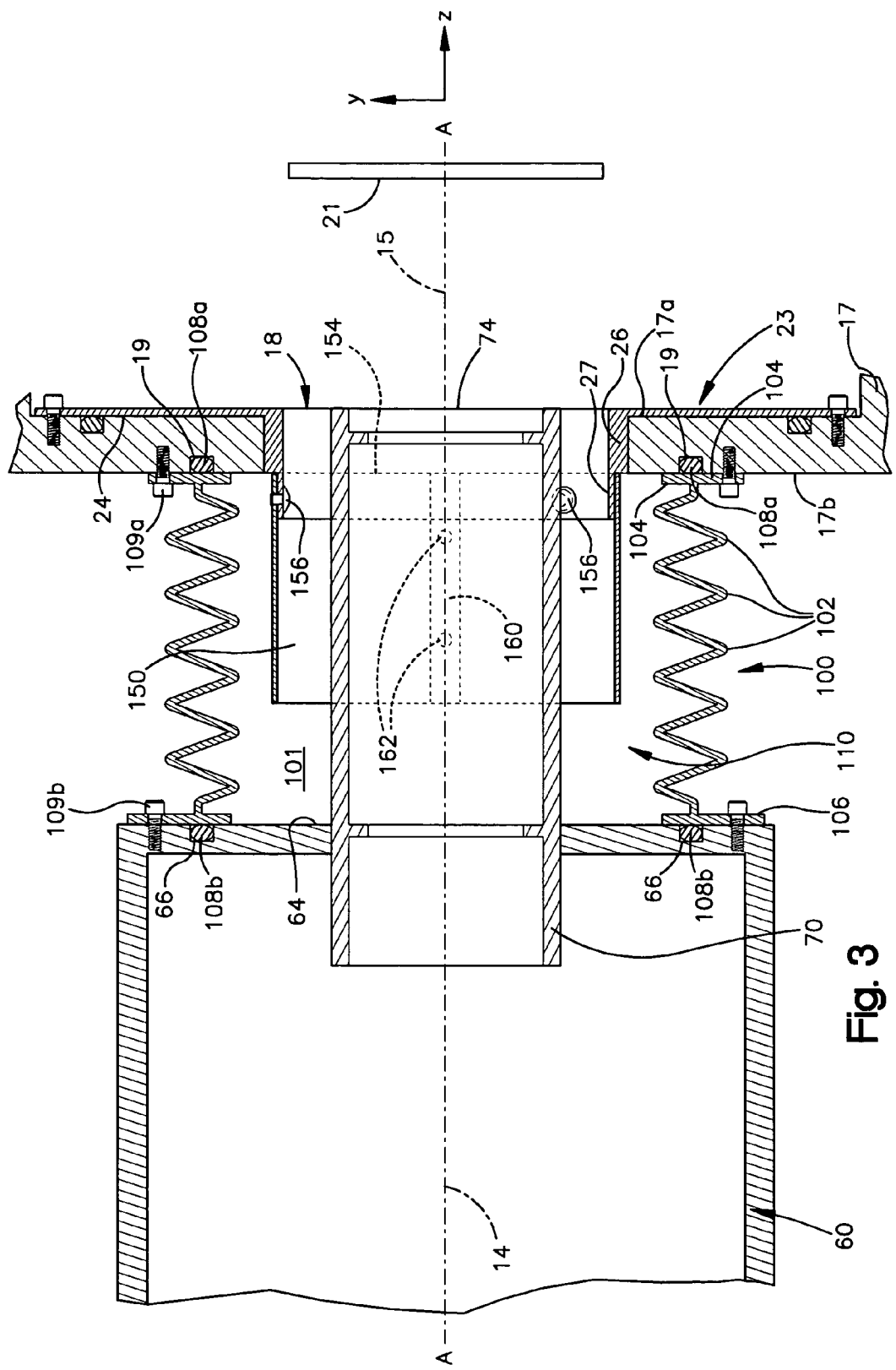
FIG. 3 is a sectional view of a portion of the ion beam implanter including a bellows and bellows liner as seen from a plane indicated by the line 3—3 in FIG. 1.

The bellows 100 is preferably fabricated of a plurality of shaped metal convolutions 102 welded together to form an accordion-like shape (best seen in FIG. 3). Preferably, the bellows is fabricated of stainless steel. The accordion shape provides for flexibility of the bellows 100 and allows limited bending or curving of the bellows 100 with respect to its longitudinal axis (labeled as A—A in FIG. 3). When the implantation station 16 is pivoted via a drive system (not shown) with respect to the resolving housing 60 the bellows 100 flexes to permit the pivoting movement. The bellows 100 flexes or curves as required by compressing the convolutions on one side of the bellows while stretching the convolutions on an opposite side of the bellows. The longitudinal axis A—A of the bellows 100 is congruent with the beam line 15.

The ends of the bellows 100 include mounting flanges 104, 106. The downstream mounting flange 104 of the bellows 100 is bolted to an upstream facing side 17b of a wall 17 of the implantation station 16, while the upstream mounting flange 106 of the bellows 100 is bolted to an end 64 of the resolving housing 60. To provide an airtight seal, an o-ring 108a is seated in a groove 19 in the upstream facing side 17b of the implantation station wall 17 and, when the bellows 100 is attached to the implantation station 16, the o-ring 108a is compressed between the bellows mounting flange 104 and the implantation station wall 17.

Similarly, to provide an airtight seal, an o-ring 108b is seated in a groove 66 in the end 64 of the resolving housing 60 and, when the bellows 100 is attached to the resolving housing 60, the o-ring 108b is compressed between the bellows mounting flange 106 and the resolving housing 60.

The downstream mounting flange 104 of the bellows 100 is affixed to the implantation station wall 17 by a plurality of bolts 109a. Similarly, the upstream mounting flange 106 of the bellows 100 is affixed to the end 64 of the resolving housing 60 by a plurality of bolts 109b.

Advantageously, a flexible liner or sleeve 150 is positioned within an interior region 110 of the bellows 100 to collect implantation byproducts that contact the liner 150. Small particles of implantation byproducts, including material sputtered off workpieces 21 and other surfaces which the ion beam 14 impinges are deposited on the liner 150 instead of the inner surface 101 of the bellows 100. Larger particles of implantation byproducts, such as broken workpieces, land near the bottom of the liner 150 instead of falling into the convolutions 102 of the bellows 100.

Collection of implantation byproducts by the liner 150 reduces the volume of byproducts floating in the implantation chamber 22 and the interior region 52 of the beam forming and directing apparatus 50 and reduces the volume of byproducts that would otherwise be deposited on an interior surface of the bellows 100. The build up of byproduct materials on the interior surface 101 of the bellows 100 tends to shorten the useful life of the bellows and possibly cause the bellows to leak. Because of the accordion shape of the bellows 100, such implantation byproduct deposits are difficult to remove.

Additionally, flexing of the bellows 100 tends to cause byproducts deposited on the bellows interior 101 to break off and migrate along the interior region 52 of the beam forming and directing apparatus 50 and the implantation chamber 22. Floating byproducts in the implantation chamber 22 or the beam forming and directing apparatus interior region 52 are undesirable as such byproducts which contact and adhere to the workpieces 21 cause contamination of the workpieces and degrade the uniformity of implantation dosage.

Accordingly, the liner 150 both improves the implantation process by reducing the volume of undesirable byproducts or contaminants deposited on the workpieces 21 during implantation and also increases the useful life of the bellows 100 by reducing the volume of byproducts coating the bellows interior surface 101.

As can best be seen in FIG. 3, an enlarged annular portion 24 of an implantation station flange 23 is bolted to a process or downstream facing side 17a of the wall 17 of the implantation station 16. The implantation station flange 23 defines a central opening 18 through which the ion beam 18 passes and into which the end portion 74 of the electron shower extension tube extends. As can best be seen in FIG. 23, the implantation station flange 23 supports the liner 150. Specifically, a reduced diameter annular portion 26 extends upstream from enlarged head portion 24 of the implantation station flange 23. The annular portion 26 includes a stepped distal portion 27. A downstream end portion 154 of the liner 150 is fitted onto the stepped distal portion and is fastened to the stepped portion 27 with three fasteners 156. When the implantation station flange 23 is affixed to the implantation station wall 17, the liner 150 extends upstream into the bellows interior region 110 as shown in FIG. 3.

The liner 150 must be fabricated of material that is vacuum-compatible and is compatible with the operating temperature of components in the vicinity of the liner. Preferably, the liner 150 is comprised of a flexible polyamide film that is rolled into a cylindrical shape and held together along an overlapping seam 160 by a pair of aluminum rivets 162. One suitable polyamide film is KAPTON® HPPST film manufactured by E.I du Pont de Nemours and Company. The thickness of the liner 150 is dependent on the application, but a thickness of 0.007" is typical. Other suitable liner materials would include heat resistant, flexible materials such as polytetrafluoroethylene (PTFE) materials.

Figure 4:
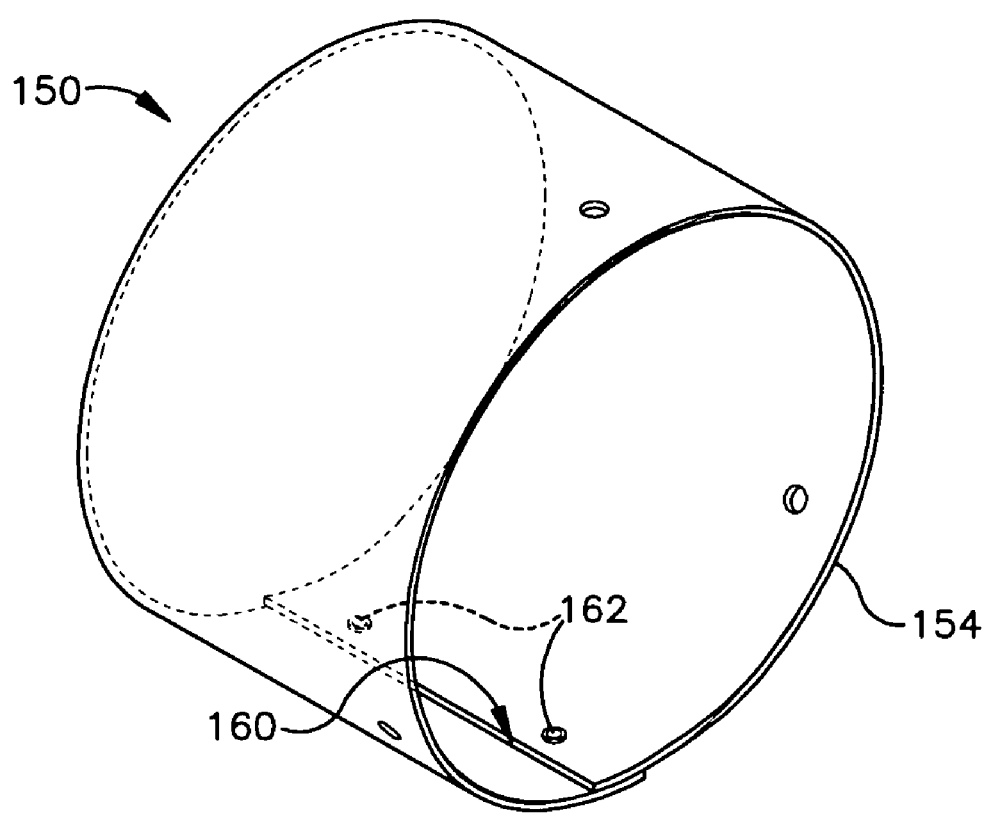
FIG. 4 is a schematic perspective view of a bellows liner of the present invention.

Since most implantation byproducts that would otherwise be deposited on the bellows inner surface 101 tend to be deposited near an end region of the bellows 100 that is adjacent the implantation station 16. Therefore, the bellows liner 150 does not have to extend along the entire longitudinal or axial length of the bellows 100 (that is, the length along axis A—A) to be effective. As can be seen in FIG. 4, the liner 150 only extends along a portion of the inner surface 101 that is adjacent the implantation station 16.

Since the implantation station flange 23 defines the opening 18 into the implantation station 16 and the liner 150 is affixed to the flange 23 and extends upstream, the liner 150 protects the interior surface 101 of the bellows 100 even if it is not in contact with the bellows inner surface 101. However, it is important is that the liner 150 be spaced radially outwardly from the electron shower 70 such that as the bellows 100 flexes to its maximum amount (7–11° from axis A—A, typically), the electron shower 70 does not rub against the liner 150 and thereby dislodge implantation byproducts adhering to the liner 150. Thus, the particular size, placement and geometry of the bellows 100 and electron shower 70 and the desired pivot movement of the implantation station 16 with respect to the resolving housing 60 will determine the diameter and length of the bellows liner 150 for a particular application.

While the invention has been described herein in it currently preferred embodiment or embodiments, those skilled in the art will recognize that other modifications may be made without departing from the invention and it is intended to claim all modifications and variations as fall within the scope of the invention.

We claim:

1. An ion beam implanter for directing an ion beam against a workpiece, the implanter comprising:
    a) an implantation station defining an evacuated implantation chamber, the workpiece supported within the implantation chamber;
    b) beam forming and directing apparatus defining an evacuated ion beam implanter interior region through which the ion beam passes on its way to the implantation station;
    c) a flexible bellows disposed between the implantation station and the beam forming and directing apparatus such that the implantation station is movable with respect to the beam forming and directing apparatus, the bellows defining an evacuated interior region though which the ion beam passes; and
    d) a flexible bellows liner positioned within the bellows interior region for collecting implantation byproducts generated during implantation of the workpiece to reduce a volume of implantation byproducts deposited on an interior surface of the bellows.

2. The ion beam implanter of claim 1 wherein the bellows liner extends within the bellows interior region from an end portion of the bellows adjacent the implantation station.

3. The ion beam implanter of claim 1 wherein the bellows liner is affixed to a flange coupled to a wall of the implantation station.

4. The ion beam implanter of claim 1 wherein the bellows liner is comprised of polyimide material.

5. The ion beam implanter of claim 4 wherein the bellows liner is comprised of polyimide film.

6. The ion beam implanter of claim 1 wherein the bellows is generally cylindrical and the bellows liner extends along at least a portion of an axial length of the bellows.

7. The ion beam implanter of claim 1 wherein the bellows is coupled at a first end to the implantation station and at an opposite end to a resolving housing of the beam forming and directing apparatus.

8. The ion beam implanter of claim 7 wherein the bellows first end includes a flange affixed to the implantation station using a plurality of fasteners and the bellows second end includes a flange affixed to the resolving housing using a plurality of fasteners.

9. The ion beam implanter of claim 1 wherein the bellows is fabricated of a plurality of convolutions.

10. The ion beam implanter of claim 1 wherein the bellows liner is replaceable.

11. A bellows pivotally coupling an implantation station and ion beam forming and directing apparatus of an ion beam implanter, a workpiece supported within the implantation station being implanted by an ion beam, implantation of the workpiece by the ion beam generating implantation byproducts, the bellows comprising:
    a) an evacuated interior region defined by the bellows though which the ion beam passes; and
    b) a bellows liner positioned within the bellows interior region for collecting implantation byproducts generated during implantation of the workpiece to reduce a volume of implantation byproducts deposited on an interior surface of the bellows, the bellows liner extending within the bellows interior region from an end portion of the bellows adjacent the implantation station.

12. The bellows of claim 11 wherein the bellows liner is affixed to a flange coupled to a wall of the implantation station.

13. The bellows of claim 11 wherein the bellows liner is comprised of polyimide material.

14. The bellows of claim 13 wherein the bellows liner is comprised of polyimide film.

15. The bellows of claim 11 wherein the bellows is generally cylindrical and the bellows liner extends along at least a portion of an axial length of the bellows.

16. The bellows of claim 11 wherein the bellows is coupled at one end to the implantation station and at an opposite end to a resolving housing of the beam forming and directing apparatus.

17. The bellows of claim 16 wherein the bellows first end includes a flange affixed to the implantation station using a plurality of fasteners and the bellows second end includes a flange affixed to the resolving housing using a plurality of fasteners.

18. The bellows of claim 11 wherein the bellows fabricated of a plurality of convolutions.

19. The bellows of claim 11 wherein the bellows liner is replaceable.

* * * * *